(12) United States Patent
Wen et al.

(10) Patent No.: US 9,146,170 B2
(45) Date of Patent: Sep. 29, 2015

(54) CAPACITIVE PRESSURE SENSOR IN AN OVERMOLDED PACKAGE

(75) Inventors: Jian Wen, Chandler, AZ (US); William G. McDonald, Payson, AZ (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 478 days.

(21) Appl. No.: 13/562,853

(22) Filed: Jul. 31, 2012

(65) Prior Publication Data

US 2014/0033814 A1    Feb. 6, 2014

(51) Int. Cl.
| G01L 7/00 | (2006.01) |
| G01L 7/08 | (2006.01) |
| G01L 9/00 | (2006.01) |
| G01L 19/14 | (2006.01) |

(52) U.S. Cl.
CPC ........................................ G01L 19/14 (2013.01)

(58) Field of Classification Search
None
See application file for complete search history.

(56) References Cited

U.S. PATENT DOCUMENTS

| 3,880,009 | A * | 4/1975 | Johnston ............................ 73/724 |
| 5,323,051 | A | 6/1994 | Adams et al. |
| 6,666,079 | B2 * | 12/2003 | Poulbot et al. ..................... 73/146 |
| 7,644,625 | B2 * | 1/2010 | Ricks ................................. 73/756 |
| 7,875,942 | B2 | 1/2011 | Cortese et al. |
| 7,898,043 | B2 | 3/2011 | Ziglioli et al. |
| 8,164,882 | B2 * | 4/2012 | Sakata et al. ..................... 361/519 |
| 8,230,745 | B2 * | 7/2012 | Rozgo et al. ........................ 73/716 |
| 8,297,125 | B2 * | 10/2012 | Stewart et al. ..................... 73/716 |
| 8,413,496 | B2 * | 4/2013 | Eslami et al. ................. 73/114.43 |
| 2009/0134481 | A1 * | 5/2009 | Sengupta ........................ 257/415 |
| 2011/0036174 | A1 | 2/2011 | Hooper et al. |

* cited by examiner

*Primary Examiner* — Peter Macchiarolo
*Assistant Examiner* — Jermaine Jenkins
(74) *Attorney, Agent, or Firm* — Jonathan N. Geld

(57) ABSTRACT

An overmolded pressure sensor package is provided. The pressure sensor die (Pcell) is capped so that the Pcell has enhanced rigidity to withstand stress effects produced by the molding encapsulant. The Pcell cap includes a hole located away from the Pcell diaphragm, so that external gas pressure can be experienced by the Pcell, while at the same time directing moisture away from the diaphragm. Gel does not need to be used, and instead a soft film can be deposited on the Pcell to protect the Pcell diaphragm from excess moisture, if needed. The Pcell cap can take the form of, for example, a dummy silicon wafer or a functional ASIC.

18 Claims, 5 Drawing Sheets

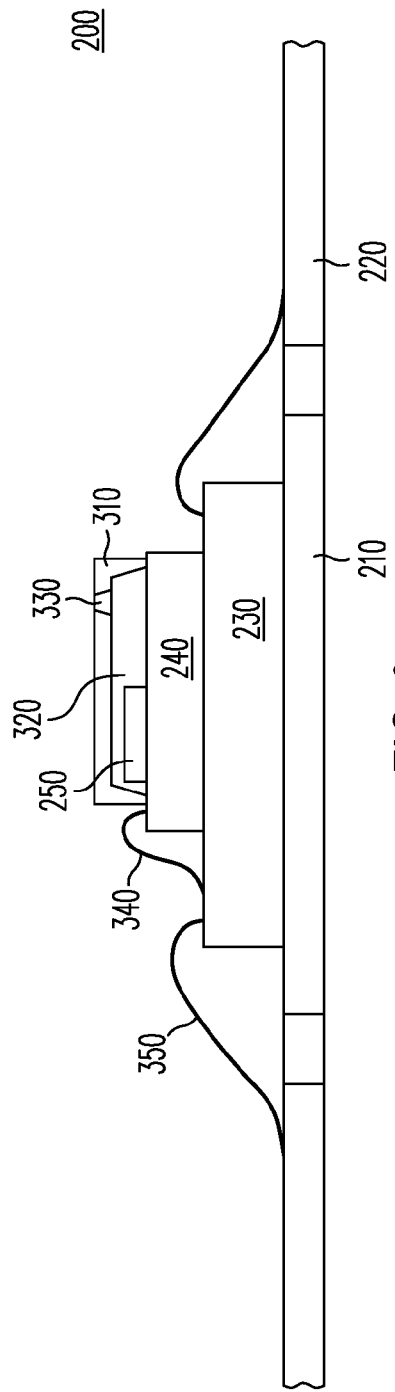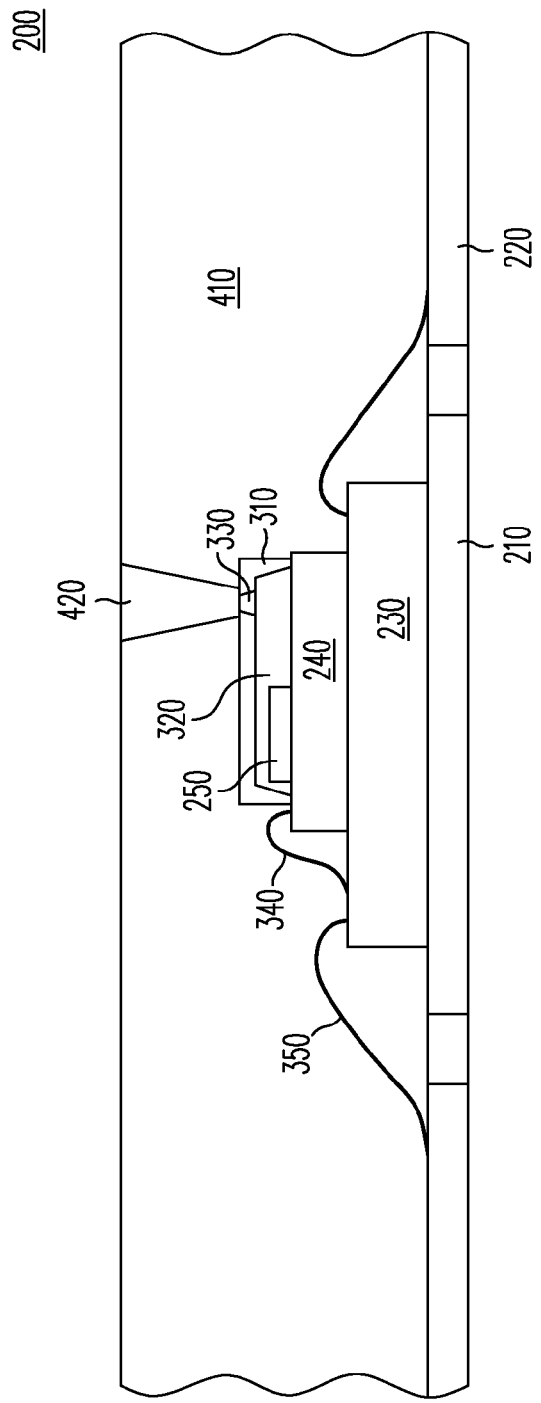

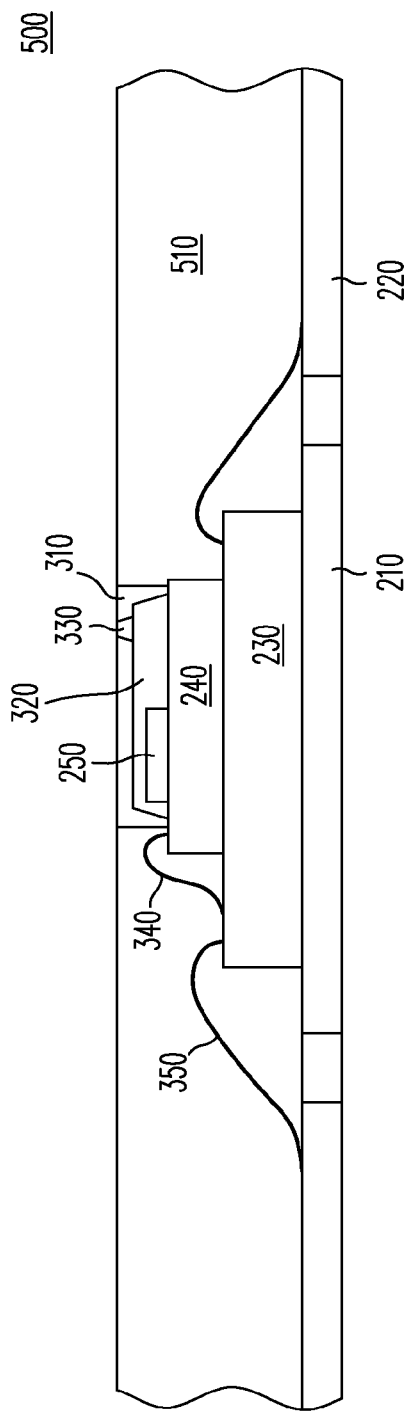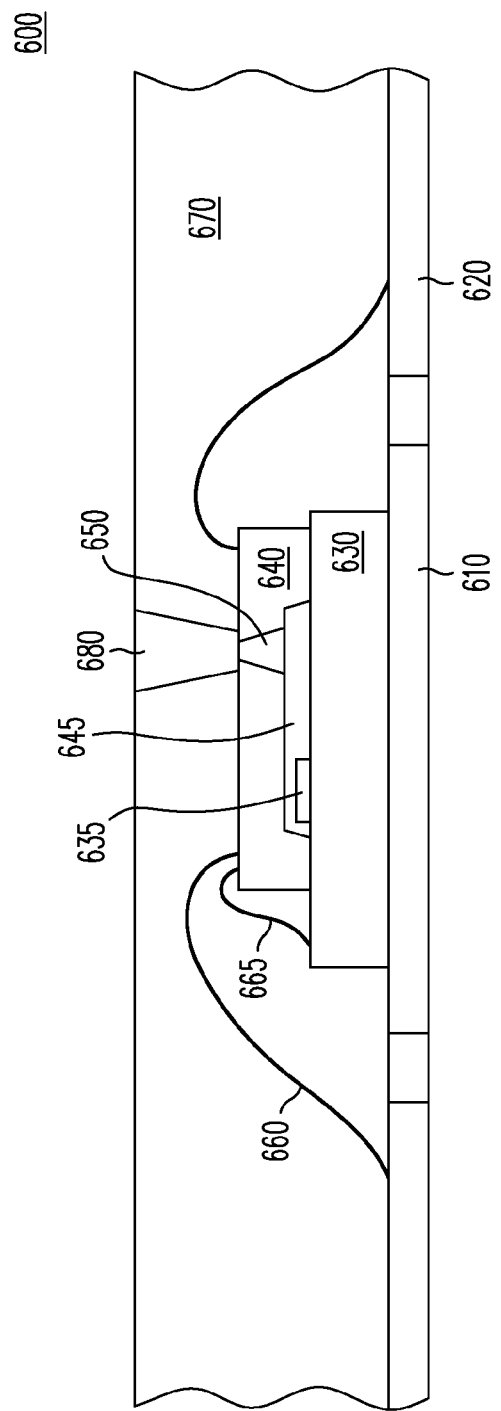

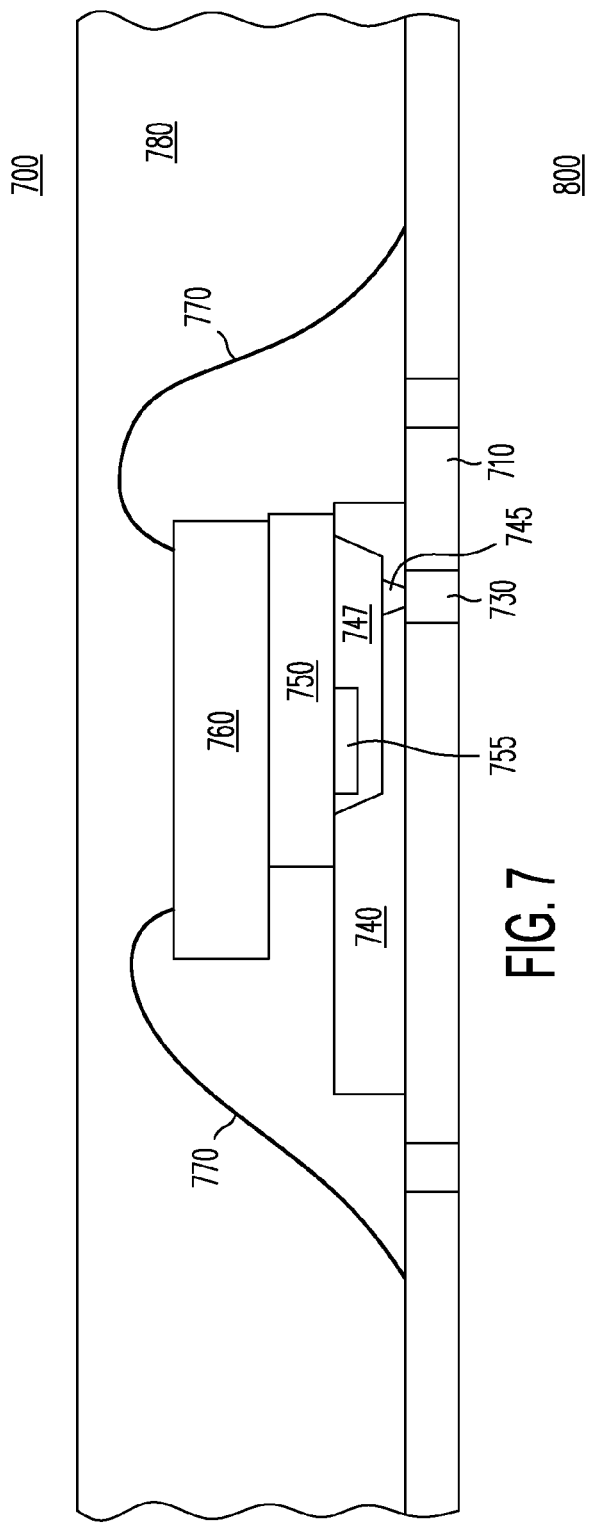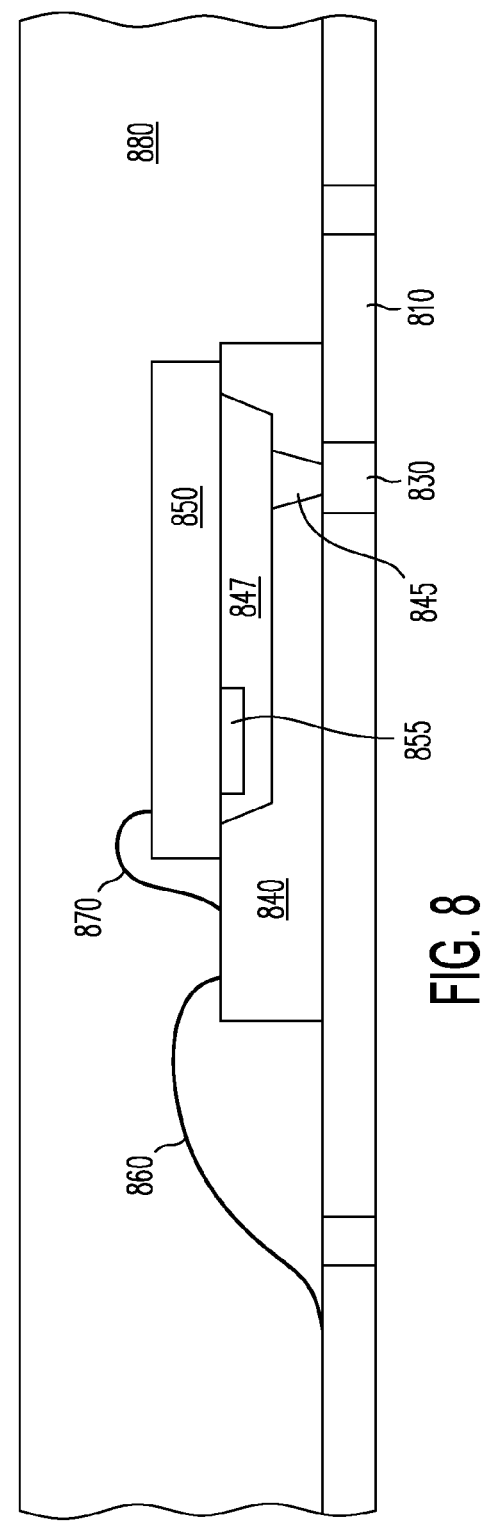

CAPACITIVE PRESSURE SENSOR IN AN OVERMOLDED PACKAGE

BACKGROUND

1. Field

This disclosure relates generally to sensor packaging, and more specifically, to providing a capacitive pressure sensor in an overmolded package.

2. Related Art

Typical pressure sensor packaging involves placing the pressure sensor die (a "Pcell") in a cavity-type package. The cavity package reduces, or eliminates, stresses on the Pcell, which can alter the performance of the Pcell in an indeterminable manner. In order to protect the Pcell and electrical contacts leading from the Pcell to other components in the package, a silicone gel is used. The gel prevents the Pcell and the electrical contacts from being exposed to moisture and other elements of the environment external to the package.

A drawback of the present design is that the gel typically used is relatively costly and a significant amount of gel is required to fill the cavity space. In addition, during a rapid decompression of the environment being sensed, bubbles can form in the gel which affect the capacitive signals in the package as well as modify the density of the gel in an indeterminable manner.

Other types of semiconductor device packages use encapsulant overmolding techniques to produce the package and protect the package components. But traditional overmolded packages can negatively affect performance of the Pcell by producing stresses on the surface of the Pcell. These stresses can alter the deformability characteristics of the Pcell diaphragm in an unpredictable manner and therefore impact the ability to use the Pcell to measure pressures.

It is therefore desirable to provide a modified pressure sensor package that reduces or eliminates the need for protective gel, while protecting the Pcell from stresses that unpredictably affect the ability to measure pressure.

BRIEF DESCRIPTION OF THE DRAWINGS

The present invention may be better understood, and its numerous objects, features, and advantages made apparent to those skilled in the art by referencing the accompanying drawings.

FIG. 3 is a simplified block diagram illustrating a cross section of the pressure sensor device package at a subsequent stage in the example of processing to that of FIG. 2.

FIG. 4 is a simplified block diagram illustrating a cross section of the pressure sensor device package at a subsequent stage in the example of processing to that of FIG. 3.

FIG. 5 is a simplified block diagram illustrating a cross-section of an alternate embodiment pressure sensor device package.

FIG. 6 is a simplified block diagram illustrating a cross-section of an alternate embodiment pressure sensor device package.

FIG. 7 is a simplified block diagram illustrating a cross-section of an alternate embodiment pressure sensor device package 700.

FIG. 8 is a simplified block diagram illustrating a cross-section of an alternate embodiment pressure sensor device package.

The use of the same reference symbols in different drawings indicates identical items unless otherwise noted. The figures are not necessarily drawn to scale.

DETAILED DESCRIPTION

An overmolded pressure sensor package is provided. The pressure sensor die (Pcell) is capped so that the Pcell has enhanced rigidity to withstand stress effects produced by the molding encapsulant. The Pcell cap includes a hole located away from the Pcell diaphragm, so that external gas pressure can be experienced by the Pcell, while at the same time directing moisture away from the diaphragm. Gel does not need to be used, and instead a soft film can be deposited on the Pcell to protect the Pcell diaphragm from excess moisture, if needed. The Pcell cap can take the form of, for example, a dummy silicon wafer or a functional ASIC.

Figure 1:
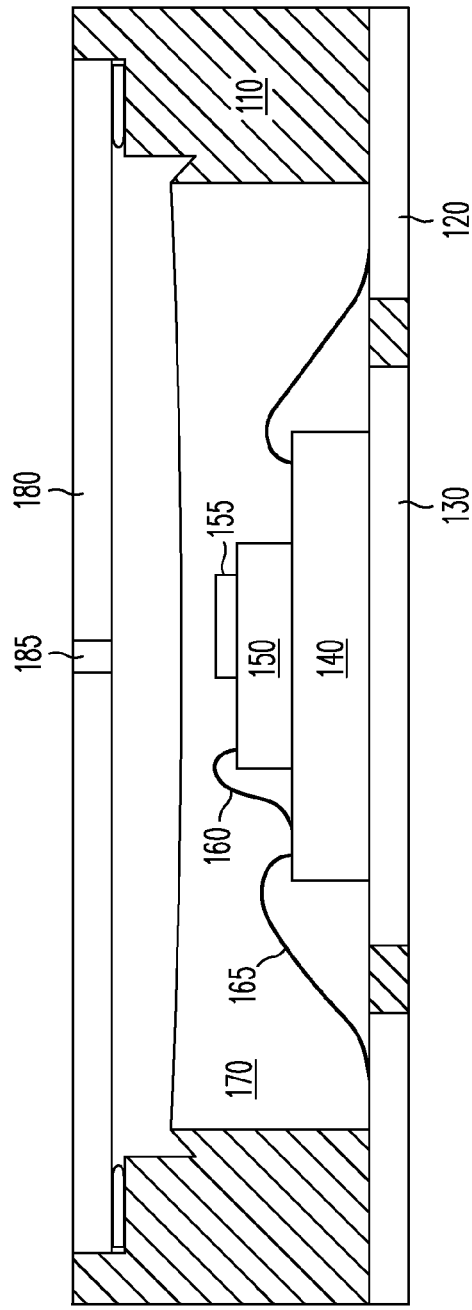
FIG. 1 is a simplified block diagram illustrating an example of a traditional cavity pressure sensor package.

FIG. 1 is a simplified block diagram illustrating an example of a traditional cavity pressure sensor package 100. Cavity pressure sensor package 100 provides a cavity formed by a molding compound 110. A lead frame is encapsulated by molding compound 110 that includes leads 120 and a device flag 130. Lead frame leads are accessible along the perimeter of the outside of the package. As illustrated, cavity package 100 can be a cavity QFN package.

As discussed above, embodiments of the lead frame incorporating leads 120 and device flag 130 are copper plated with nickel and gold, or nickel, palladium and gold. Molding compound 110 can be any appropriate encapsulant including, for example, silica-filled epoxy molding compounds, plastic encapsulation resins, thermoplastic materials such as polyphenylene sulfide (PPS), and other polymeric materials.

FIG. 1 further includes a control die 140 that can take the form of, for example, an application specific integrated circuit or another type of signal processor. Pressure sensor die (Pcell) 150 is mounted on control die 140, and includes a pressure-sensitive diaphragm 155. Pressure-sensitive diaphragm 155 is deformable in response to a pressure imposed on the surface of the diaphragm external to the Pcell. Pcell 150 is electrically coupled to control die 140 by, for example, wire bond 160. Likewise, control die 140 is electrically coupled to one or more lead frame leads by wire bonds such as wire bond 165.

In order to protect the electronic components (e.g., control die 140 and Pcell 150) and the electronic couplings (e.g., wire bonds), the cavity region of cavity pressure sensor package 100 is filled with a silicone gel 170 to a level above that of the highest component or electronic coupling. The cavity region is then capped with a pressure permeable cover 180 that includes, for example, an inlet port 185 to permit external fluid pressure to interact with diaphragm 155 of Pcell 150 through the silicone gel 170.

Since the entire cavity region of the traditional cavity pressure sensor package is filled with the silicone gel, there is an increased cost associated with the quantity of gel consumed. Also, as discussed above, under high pressure, gasses in the cavity can be forced into gaps formed at, for example, an interface between leads 120 and mold compound 110. During rapid decompression, the trapped air can form air bubbles within the silicone gel, which can disturb the quality of measurements made by the Pcell.

In an effort to both reduce the size of pressure sensor devices and to reduce the amount of power consumed by the entire pressure monitoring system, pressure monitoring devices have transitioned from using voltage-based signals between the sensors and the processor to using capacitive signals between the sensors and the processor. This has an advantage of fewer transistors in the sensor devices, which reduces both the size and the cost of the sensor devices (and therefore the entire system). The processor in such a system performs capacitance to voltage conversions, if any. A drawback of a capacitive signal-based system is that capacitive signals are more sensitive to environmental changes. For example, formation of bubbles in the silicone gel can result in a parasitic capacitance that alters a signal received by control die 140 from Pcell 150. In addition, the bubbles can move the wires of the wire bonds. These wires are sensitive to movement and therefore altering the physical layout of the system would also alter the received data signals.

Figure 2:
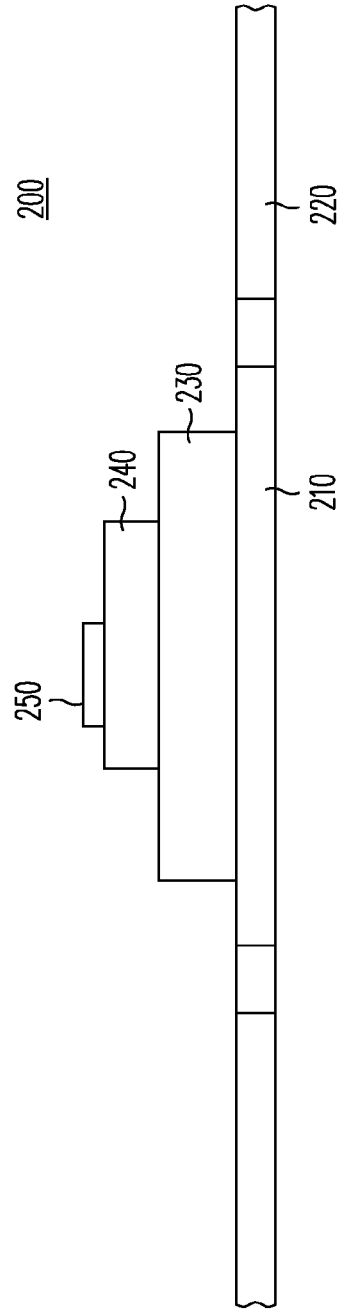
FIG. 2 is a simplified block diagram illustrating a cross-section of a pressure sensor device package at a stage in one example of processing.

FIG. 2 is a simplified block diagram illustrating a cross-section of a pressure sensor device package 200 at a stage in one example of processing, according to an embodiment of the present invention. The pressure sensor device package includes a package substrate. As illustrated, the package substrate includes a lead frame including a flag 210 and leads 220 is provided. In some embodiments, the lead frame is attached to a holder during processing steps (not shown). A control die 230 is attached to flag 210 using an adhesive. The adhesive can be of a standard type used in semiconductor packaging processing. Pcell 240 is attached to a major surface of the control die opposite to the control die major surface attached to flag 210. Pcell 240 is attached to control die 230 using an adhesive. Pcell 240 includes a diaphragm 250 that is deformable in response to pressures incident to the surface of diaphragm 250 external to Pcell 240.

FIG. 3 is a simplified block diagram illustrating a cross section of pressure sensor device package 200 at a subsequent stage in the example of processing, according to an embodiment of the present invention. A pressure-permeable cap 310 is attached to a major surface of Pcell 240 that includes diaphragm 250. Cap 310 defines a cavity region 320 that encompasses diaphragm 250 as well as another portion of the major surface of the Pcell. Cap 310 further includes an inlet port 330 that permits external fluid pressure to interact with diaphragm 250 of Pcell 240. Cap 310 can be, for example, a silicon die formed by etching to include cap inlet port 330 and etched to define cavity region 320. The cap is made of a material that provides sufficient rigidity to reduce or remove stress effects on the Pcell diaphragm produced by encapsulation, discussed more fully below, and to distribute the forces generated by encapsulation in a region of the Pcell surface away from the diaphragm.

Control die 230 includes a number of bond pads (not shown) arranged on a major surface of the control die opposite to the control die major surface attached to flag 210. One or more of the control die bond pads are electrically coupled to corresponding bond pads on a major surface of Pcell 240 by wire bonds 340. Similarly, one or more of the control die bond pads are electrically coupled to leads on a lead frame 220 by wire bonds 350.

FIG. 4 is a simplified block diagram illustrating a cross section of pressure sensor device package 200 at a subsequent stage in the example of processing, according to an embodiment of the present invention. A molding material is applied to the lead frame, control die, Pcell, and wire bonds illustrated in FIG. 3, forming an encapsulant 410 that encapsulates the structures within the molding material and forms a panel. The molding material is formed in a manner that produces a package inlet port 420 over the region of cap 310 that includes cap inlet port 330.

One method for forming the encapsulant such that package inlet port 420 is produced is a film-assisted mold technology known in the art. For example, film-assisted molding can be performed by pressing a shaped pin onto the top of the die with a flexible film between the pin and the mold compound. The mold compound will not flow to any location in which the pin is pressing down. For package 200, the pin can be of a shape appropriate to forming package inlet port 420 and is pressed down over the region including cap inlet port 330.

Subsequent to formation of the panel using the film-assist molded encapsulant, the pressure sensor packages can be singulated and be subjected to any additional processing per the desired application.

As discussed above, cap 310 is structurally rigid. This rigidity helps to counter stresses placed upon Pcell 240 by the encapsulant that could have unpredictable effects on capacitive pressure measurements taken by the Pcell. Further, the area of the surface of the Pcell that is in contact with the encapsulant is reduced by the area covered by the cap, which also reduces possible stress effects. Thus, the Pcell is protected by both the cap and the encapsulant without losing utility. Further, the fluid inlet ports (e.g., 310 and 420) are offset from Pcell diaphragm 250 to avoid a direct exposure of the diaphragm to moisture present in the external fluid (e.g., tire gasses). Another mechanism to protect the diaphragm from moisture can include a thin film placed over the region of the Pcell covered by cap 310 prior to placing the cap on the Pcell. Types of film can include, for example, chemical vapor deposited parylene.

FIG. 5 is a simplified block diagram illustrating a cross-section of an alternate embodiment pressure sensor device package 500, according to an embodiment of the present invention. Components of package 500 include those provided in system 200, with the exception that a molding material is applied to the lead frame, control die, Pcell, cap, and wire bonds illustrated in FIG. 3, forming an encapsulant 510 that encapsulates the structures within the molding material, but leaves exposed the top surface of 310. The encapsulant can be formed in this manner using a film-assisted mold technology known in the art, wherein the mold compound is prevented from forming over the top of cap 310 and leaving exposed cap inlet port 330.

One advantage of the system illustrated in FIG. 5 over the system illustrated in FIG. 4 is that since there is no overmolding region over the top major surface of cap 310, the overall package thickness of package 500 can be less than that of package 200. In addition, since the entirety of cap 310 is not overmolded in package 500, the Pcell/cap structure may experience a lower stress level than that of the completely overmolded structure in package 200.

FIG. 6 is a simplified block diagram illustrating a cross-section of an alternate embodiment pressure sensor device package 600. A lead frame including a flag 610 and leads 620 is provided. A pressure sensor die (Pcell) 630 is attached to flag 610 using an adhesive, which is of a standard type used in semiconductor packaging processing. Pcell 630 has a diaphragm 635 that is deformable in response to pressures incident to the surface of diaphragm 635 external to Pcell 630.

A shaped control die 640 is attached to a major surface of Pcell 630 that is opposite to the Pcell major surface attached to flag 610. Shaped control die 640 is formed in a manner to define a cavity region 645 that encompasses a portion of the major surface of Pcell 630, including diaphragm 635. Shaped control die 640 is also formed in a manner to provide a cap inlet port 650 that can permit external fluid pressure to interact with diaphragm 635 when control die 640 is attached to Pcell 630. The cavity and inlet port features of shaped control die 640 can be provided in a variety of ways known in the art, including, for example, etching, drilling, and laser drilling. Shaped control die 640 is electrically coupled to contacts on the major surface of Pcell 630 by wire bonds 665. Control die 640 is also electrically coupled to flags 620 by one or more wire bonds 660.

A molding material is applied to the lead frame, Pcell, control die, and wire bonds, forming an encapsulant 670 that encapsulates the structures within the molding material and forms a panel. As in FIG. 4, the molding material is formed in a manner that produces a package inlet port 680 over the region of shaped control die 640 that includes cap inlet port 650. As discussed above, one method for forming the encapsulant such that package inlet port 680 is produced is a film-assisted mold technology known in the art.

Advantages of the embodiment illustrated in FIG. 6 include a thinner package design because the shaped control die doubles in function as the Pcell cap. Thus, fewer components are stacked in the region of the Pcell. A second advantage of the embodiment illustrated in FIG. 6 is, since there are fewer components that need to be stacked, there are fewer steps involved in the fabrication of this embodiment. Thus, processing can be performed in a quicker manner and in a more economical fashion. However, additional processing is involved in formation of control die 640 prior to package assembly, in order to create cavity region 645 and cap inlet port 650.

FIG. 7 is a simplified block diagram illustrating a cross-section of an alternate embodiment pressure sensor device package 700. Some pressure sensing applications are better served by a backside pressure inlet provided through a package flag or package substrate. FIG. 7 illustrates a pressure sensor device package that provides such a backside pressure inlet, while also incorporating the advantages of embodiments of the present invention. A package substrate 710 that includes an air inlet 730 is provided.

A Pcell cap 740 is attached to a package substrate 710 using an adhesive. Pcell cap 740 is formed such that a cavity region 747 is defined as well as a cap inlet port 745, which can admit external fluid pressure to the cavity region. As with cap 310, Pcell cap 740 can be made of a silicon die that is etched, or otherwise processed, to include the cavity region and cap inlet port features. Pcell cap 740 is mounted on package substrate 710 such that cap inlet port 745 is aligned with air inlet 730, and cavity region 745 faces away from the surface of the package substrate.

A Pcell 750 is attached to Pcell cap 740, such that a pressure deformable diaphragm 755 is located within cavity region 747. Control die 760 is attached to the major surface of Pcell 750 facing away from Pcell cap 740. Electrical couplings between control die 760 and Pcell 750 can also be made in the attachment region along the joined major surfaces. Control die 760 can also be electrically coupled to contacts on package substrate 710 through the use of wire bonds 770.

A molding material is applied to the package substrate, Pcell cap, Pcell, control die, and wire bonds, forming an encapsulant 780 that encapsulates the structures within the molding material. The molding material can include those types of materials discussed above.

FIG. 8 is a simplified block diagram illustrating a cross-section of an alternate embodiment pressure sensor device package 800. As with sensor device package 700, sensor device package 800 includes a backside pressure inlet provided through the package flag or package substrate. A package substrate 810 that includes an air inlet 830 is provided.

A shaped control die 840 is attached to package substrate 810 such that air inlet 830 is aligned with a cap inlet port 845 formed on the shaped control die. Shaped control die 840 is further formed in a manner to define a cavity region 847. Cap inlet port 845 can permit external fluid pressure to enter into cavity region 847. The cavity and inlet port features of shaped control die 840 can be provided in a variety of ways known in the art, including, for example, etching, drilling, and laser drilling.

A Pcell 850 is attached to shaped control die 840, such that a pressure deformable diaphragm 855 is located within cavity region 847. Pcell 850 is configured such that electrical contact pads are accessible on a Pcell major surface that is opposite the major surface attached to control die 840. These electrical contact pads are electrically coupled to electrical contacts on a major surface of shaped control die 840 using wire bonds 870. Shaped control die 840 is also electrically coupled to contacts on package substrate 810 using wire bonds 860.

As discussed above with regard to the embodiment illustrated in FIG. 6, advantages of the alternative embodiment in FIG. 8 include a thinner package design due to the control die doubling in function as the Pcell cap, fewer steps involved in fabrication, and a quicker and more economical fabrication. But, as with the embodiment illustrated in FIG. 6, additional processing is involved in formation of control die 840 prior to packaging in order to create the cavity region and cap inlet port. In addition, Pcell 850 may need an atypical design in that electrical contacts are provided on a major surface opposite that of the deformable diaphragm 855.

Figure 9:
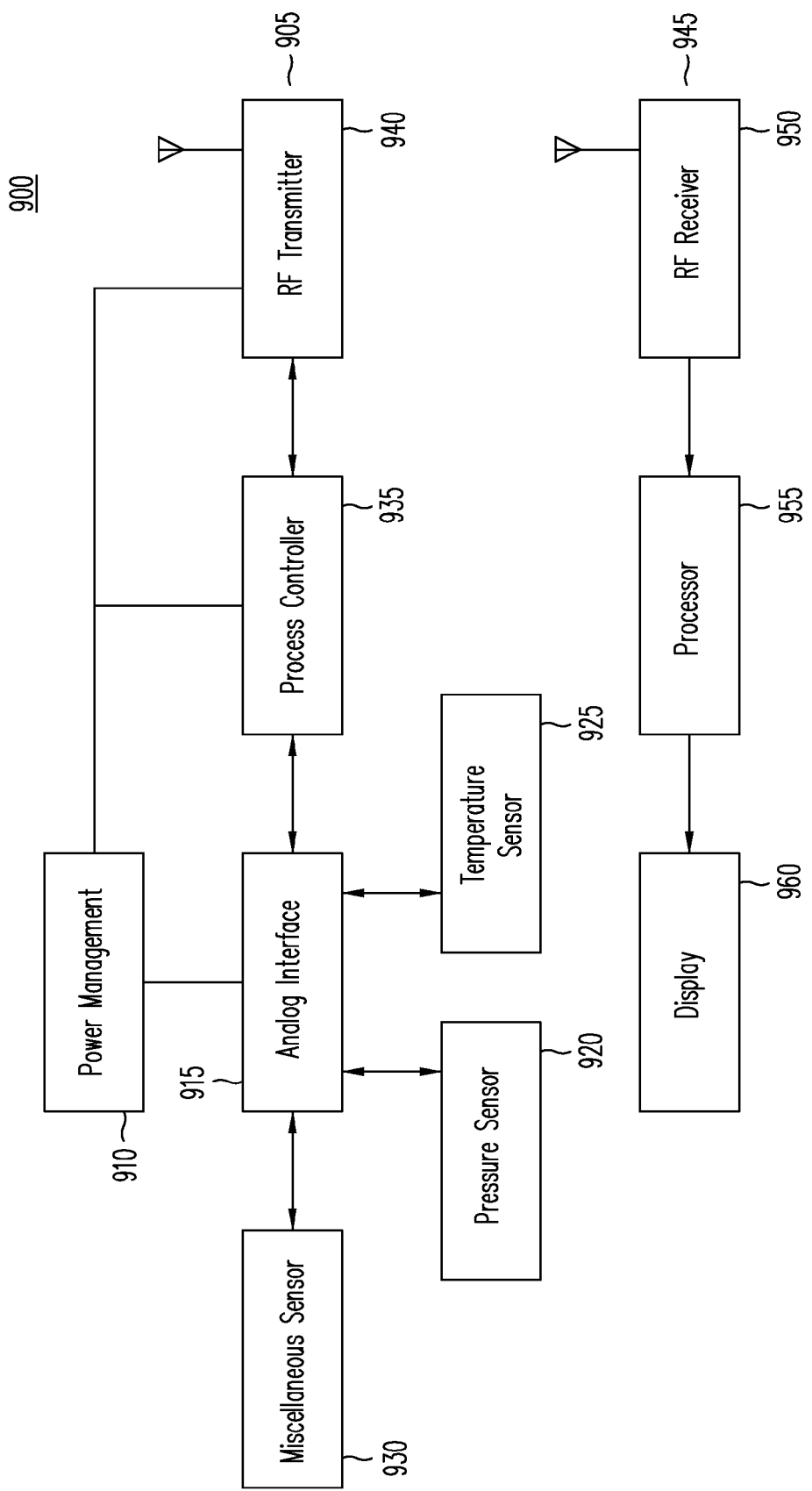
FIG. 9 is a simplified block diagram illustrating a tire pressure monitoring system, usable in association with embodiments of the present invention.

FIG. 9 is a simplified block diagram illustrating a tire pressure monitoring system 900, usable in association with embodiments of the present invention. Tire pressure monitoring system (TPMS) 900 includes two portions: a wheel module 905 and a receiver portion 955. Wheel module 905 is typically located within one or more tires on a vehicle, while receiver portion 945 is contained outside of the tires.

Wheel module 905 includes a power management circuit 910 that is coupled to a power supply for the wheel module. Power management circuit 910 separately powers and analogue interface 915, a process controller 935, and a radio frequency (RF) transmitter 940. Further, a pressure sensor 920, a temperature sensor 925, and one or more miscellaneous sensors 930 can receive power either directly from power management circuit 910 or through analogue interface 915. An input/output of pressure sensor 920 is connected to a first signal input/output of analog interface 915. An input/output of temperature sensor 925 is connected to a second signal input/output of analog interface 915. An input/output of miscellaneous sensor 930 is connected to a third signal input/output of analog interface 915. Analog interface 915 is further connected to an input/output of process controller 935. And input/output of process controller 935 is coupled to an input/output of RF transmitter 940. RF transmitter 940 has an antenna for transmitting and RF signal that is received by an antenna of RF receiver 950. Examples of frequencies used as the RF frequency are, by way of example only, from 300 MHz to 1 GHz.

Receiver portion 945 includes RF receiver 950, a processor 955 and a display 960. An output of RF receiver 950 is connected to an input of processor 955. Display 960 is connected to an output of processor 955.

In operation, wheel module 905 is mounted within a vehicle tire. Pressure sensor 920 functions to sense the tires pressure when the pressure sensor is powered. Pressure sensor 920 can include an embodiment of the present invention such as that illustrated in FIGS. 4-8. Similarly, temperature sensor 925 functions to sense the temperature of the air within the tire when the temperature sensor is powered. The temperature measurement can be done using variable capacitance, variable resistance, or a diode voltage. Miscellaneous sensors 930 can be configured to measure additional environmental and performance data, as needed. Analog interface 915 functions to perform an analog-to-digital conversion of the outputs of the various sensors. Additionally, analog interface 915 can perform other functions, such as providing clock synchronization and control signals to the sensors, providing reference voltages and performing correction of sensor errors and nonlinearity errors associated with the pressure and temperature measurements, and interpreting differential capacitance measurements provided by the sensors. Process controller 935 can be configured to gather pressure and temperature measurements at a given time interval and send that data via RF transmitter 940 at a second time interval. Further, in order to manage battery power within the wheel module, process controller 935 can selectively connect and disconnect power source from the other components of the wheel module using the power management circuit. Power management circuit 910 can include power saving logic and functionality incorporated therein to implement various low-power modes and timing sense parameters.

Process controller 935 can additionally contain logic circuitry or software code in a memory for purpose of identifying, based solely on the pressure and temperature of the tire, or in response to one or more of the miscellaneous sensors, when the tire is in motion. In response to determining whether the tire is in motion, process controller 935 can provide control over all battery power consumption as determined by the rate of measurement by the various sensors and the transmission rate of RF transmitter 940. Process controller 935 can monitor the tire pressure level indicated by pressure sensor 920 and provide a low or high pressure alarm signal to RF transmitter 940, when the tire pressure reaches or falls below a predetermined value or reaches or rises above a second predetermined value. The pressure alarm signal is received by RF receiver 950 and is processed by processor 955 to signal a user of the vehicle that the tire pressure has fallen below or risen above the predetermined values. For example, when processor 955 detects that an air leak exists (e.g., that the tire pressure has fallen below a predetermined threshold), and alarm, either visible or audible, is sent to display 960. Processor 955 can be implemented as a microcontroller with programmable memory such as a ROM for storing software or as a state machine with hardware logic to implement the method discussed.

The pressure sensor device packages provided by the embodiments discussed above have an advantage of providing an overmolded package design that reduces or eliminates packaging stress on pressure sensor die. This occurs because of the protection of the Pcell provided by the Pcell cap or the shaped control die, by both including an additional rigid structure on the Pcell and decreasing the external surface area of the Pcell exposed to the package encapsulant. In addition, the cavity designs of the above embodiments reduce or eliminate the need for silicone gel by decreasing opportunity for exposure to moisture and reducing the area needing protection. This also tends to reduce costs for constructing the pressure sensor device packages.

By now it should be appreciated that there has been provided a semiconductor device package that includes a pressure sensor die having a pressure deformable diaphragm disposed at a region of a first major surface of the pressure sensor die, and a shaped cap wafer attached to the first major surface of the pressure sensor die. A cavity is formed between a portion of the shaped cap wafer and a portion of the first major surface of the pressure sensor die. The portion of the first major surface of the pressure sensor die includes the region where the pressure deformable diaphragm is disposed, and the shaped cap wafer includes a pressure inlet port configured to admit gases external to the cavity into the cavity.

One aspect of the above embodiment provides for the pressure inlet port to be located in a region of the shaped cap wafer opposing the portion of the first major surface of the pressure sensor die that is not the region including the pressure deformable diaphragm. In another aspect, the shaped cap wafer is a silicon wafer shaped to form the cavity. In still another aspect, the shaped cap wafer is an active semiconductor device having an external shape configured to form the cavity.

In another aspect of the above embodiment, the semiconductor device package further includes: a package substrate; an active semiconductor device adhesively coupled to the package substrate at a first major surface of the active semiconductor device where the pressure sensor die is adhesively coupled to a second major surface of the active semiconductor device and the second major surface of the active semiconductor device opposes the first major surface of the active semiconductor device; and, encapsulant over and around the package substrate, over and around the active semiconductor device, over and around the pressure sensor die, and around the shaped cap wafer. In a further aspect, the semiconductor device package further includes encapsulant over the shaped cap wafer where the encapsulant is formed to provide a package inlet port over the pressure inlet port of the shaped cap wafer. In another further aspect, the active semiconductor device is a control die, the pressure sensor die is electrically coupled to the control die, and the control die is configured to receive and process signals generated by the pressure sensor die.

In another aspect of the above embodiment, the semiconductor device package further includes: a package substrate where the pressure sensor die is adhesively coupled to the package substrate at a second major surface of the pressure sensor die that opposes the first major surface of the pressure sensor die; and, encapsulant over and around the package substrate, over and around the pressure sensor die, and around the shaped cap wafer. In a further aspect, the semiconductor device package further includes an active semiconductor device electrically coupled to the pressure sensor die, where the active semiconductor devices configured to receive and process signals generated by the pressure sensor die, and at least a portion of the active semiconductor device is encapsulated by the encapsulant. In still a further aspect, the active semiconductor device is the shaped cap wafer. In yet a further aspect, the semiconductor device package further includes encapsulant over the shaped cap wafer where the encapsulant is formed to provide a package inlet port over the pressure inlet port of the shaped cap wafer.

In another aspect of the above embodiment, the semiconductor device package further includes: a package substrate, wherein the package substrate includes a substrate pressure inlet, and the shaped cap wafer is adhesively attached to the package substrate such that the substrate pressure inlet and the shaped cap wafer pressure inlet are aligned; and, encapsulant over and around the package substrate, over and around the shaped cap wafer, and around at least a portion of the pressure sensor die. In a further aspect, the semiconductor device package further includes an active semiconductor device electrically coupled to the pressure sensor die, where the active semiconductor device is configured to receive and process signals generated by the pressure sensor die and at least a portion of the active semiconductor device is encapsulated by the encapsulant. In still a further aspect, the active semiconductor device is adhesively attached to a second major surface of the pressure sensor die that opposes the first major surface of the pressure sensor die. In another further aspect, the active semiconductor device is the shaped cap wafer.

In another embodiment, a method is provided for forming a packaged semiconductor device assembly. The method includes: providing a surface embodied within the package semiconductor device assembly; affixing a pressure sensor die to a portion of the surface; and, affixing a shaped cap wafer to the second major surface of the pressure sensor die. The pressure sensor die is affixed to the surface at a first major surface of the pressure sensor die. A second major surface of the pressure sensor die, which opposes the first major surface, includes a pressure deformable diaphragm. A cavity is formed between a portion of the shaped cap wafer and a portion of the second major surface of the pressure sensor die and the portion of the second major surface includes a pressure deformable diaphragm. The shaped cap wafer includes a pressure inlet port configured to admit gases external to the cavity into the cavity.

One aspect of the above embodiment further includes forming an encapsulated region over and around the pressure sensor die and the shaped cap wafer, where the forming is performed to provide a package inlet port over the pressure inlet port of the shaped cap wafer, and the package inlet port is configured to admit gases external to the encapsulant into the cavity through the pressure inlet port of the shaped cap wafer. Another aspect of the above embodiment further includes performing said forming of the encapsulated region using a film-assisted molding technique to form the package inlet port.

Another embodiment provides a tire pressure monitoring system that includes a wheel module configured to be mounted in a vehicle tire, where the wheel module comprises: a process controller configured to process signals from one or more sensors; a pressure sensor die, coupled to the process controller, and including a pressure deformable diaphragm disposed a region of a first major surface of the pressure sensor die; a shaped cap wafer adhesively coupled to the first major surface of the pressure sensor die; and, a radio-frequency transmitter, coupled to the process controller, and configured to transmit sensor information provided by the process controller. A cavity is formed between a portion of the shaped cap wafer and a portion of the first major surface of the pressure sensor die. The portion of the first major surface of the pressure sensor die includes the region where the pressure deformable diaphragm is disposed. The shaped cap wafer includes a pressure inlet port configured to admit gases external to the cavity into the cavity. In one aspect of this embodiment, the shaped cap wafer includes a silicon wafer shaped to form the cavity.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 9 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the described Pcell caps can be made from a variety of materials that can be shaped to include the cavity forming region and the fluid inlets, while distributing the stresses imposed by the encapsulant. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a pressure sensor die comprising a pressure deformable diaphragm disposed at a region of a first major surface of the pressure sensor die;
   a shaped cap wafer attached to the first major surface of the pressure sensor die, wherein
      a cavity is formed between a portion of the shaped cap wafer and a portion of the first major surface of the pressure sensor die,
      the portion of the first major surface of the pressure sensor die comprises the region where the pressure deformable diaphragm is disposed, and
      the shaped cap wafer includes a pressure inlet port configured to admit gasses external to the cavity into the cavity;
   a package substrate;
   an active semiconductor device adhesively coupled to the package substrate at a first major surface of the active semiconductor device, wherein
      the pressure sensor die is adhesively coupled to a second major surface of the active semiconductor device, and
      the second major surface of the active semiconductor device opposes the first major surface of the active semiconductor device;
   an encapsulant over and around the package substrate, over and around the active semiconductor device, over and around the pressure sensor die, and around the shaped cap wafer.

2. The semiconductor device package of claim 1 wherein the pressure inlet port is located in a region of the shaped cap wafer opposing the portion of the first major surface of the pressure sensor die that is not the region including the pressure deformable diaphragm.

3. The semiconductor device package of claim 1 wherein the shaped cap wafer comprises a silicon wafer shaped to form the cavity.

4. The semiconductor device package of claim 1 wherein the shaped cap wafer comprises an active semiconductor device having an external shape configured to form the cavity.

5. The semiconductor device package of claim 1 further comprising:
   encapsulant over the shaped cap wafer, wherein the encapsulant is formed to provide a package inlet port over the pressure inlet port of the shaped cap wafer.

6. The semiconductor device package of claim 1, wherein the active semiconductor device comprises a control die, the pressure sensor die is electrically coupled to the control die, and
   the control die is configured to receive and process signals generated by the pressure sensor die.

7. A semiconductor device package comprising:
   a pressure sensor die comprising a pressure deformable diaphragm disposed at a region of a first major surface of the pressure sensor die;
   a shaped cap wafer attached to the first major surface of the pressure sensor die, wherein
      a cavity is formed between a portion of the shaped cap wafer and a portion of the first major surface of the pressure sensor die,
      the portion of the first major surface of the pressure sensor die comprises the region where the pressure deformable diaphragm is disposed, and
      the shaped cap wafer includes a pressure inlet port configured to admit gasses external to the cavity into the cavity;
   a package substrate, wherein
      the pressure sensor die is adhesively coupled to the package substrate at a second major surface of the pressure sensor die that opposes the first major surface of the pressure sensor die; and
   an encapsulant over and around the package substrate, over and around the pressure sensor die, and around the shaped cap wafer.

8. The semiconductor device package of claim 7 further comprising:
   an active semiconductor device electrically coupled to the pressure sensor die, wherein
      the active semiconductor device is configured to receive and process signals generated by the pressure sensor die, and
      at least a portion of the active semiconductor device is encapsulated by the encapsulant.

9. The semiconductor device package of claim 8 wherein the active semiconductor device comprises the shaped cap wafer.

10. The semiconductor device package of claim 9 further comprising:
    encapsulant over the shaped cap wafer, wherein the encapsulant is formed to provide a package inlet port over the pressure inlet port of the shaped cap wafer.

11. A semiconductor device package comprising:
    a pressure sensor die comprising a pressure deformable diaphragm disposed at a region of a first major surface of the pressure sensor die;
    a shaped cap wafer attached to the first major surface of the pressure sensor die, wherein
       a cavity is formed between a portion of the shaped cap wafer and a portion of the first major surface of the pressure sensor die,
       the portion of the first major surface of the pressure sensor die comprises the region where the pressure deformable diaphragm is disposed, and
       the shaped cap wafer includes a pressure inlet port configured to admit gasses external to the cavity into the cavity;
    a package substrate, wherein
       the package substrate comprises a substrate pressure inlet, and
       the shaped cap wafer is adhesively attached to the package substrate such that the substrate pressure inlet and the shaped cap wafer pressure inlet are aligned; and
    an encapsulant over and around the package substrate, over and around the shaped cap wafer, and around at least a portion of the pressure sensor die.

12. The semiconductor device package of claim 11 further comprising:
    an active semiconductor device electrically coupled to the pressure sensor die, wherein the active semiconductor device is configured to receive and process signals generated by the pressure sensor die, and at least a portion of the active semiconductor device is encapsulated by the encapsulant.

13. The semiconductor device package of claim 12 wherein the active semiconductor device is adhesively attached to a second major surface of the pressure sensor die that opposes the first major surface of the pressure sensor die.

14. The semiconductor device package of claim 12 wherein the active semiconductor device comprises the shaped cap wafer.

15. A method for forming a packaged semiconductor device assembly, the method comprising:

providing a surface embodied within the packaged semiconductor device assembly;

affixing a pressure sensor die to a portion of the surface, wherein the pressure sensor die is affixed to the surface at a first major surface of the pressure sensor die, and a second major surface of the pressure sensor die, opposing the first major surface, comprises a pressure deformable diaphragm;

affixing a shaped cap wafer to the second major surface of the pressure sensor die, wherein a cavity is formed between a portion of the shaped cap wafer and a portion of the second major surface of the pressure sensor die and the portion of the second major surface comprises the pressure deformable diaphragm, and the shaped cap wafer includes a pressure inlet port configured to admit gasses external to the cavity into the cavity; and forming an encapsulated region over and around the pressure sensor die and the shaped cap wafer, wherein said forming is performed to provide a package inlet port over the pressure inlet port of the shaped cap wafer, and the package inlet port is configured to admit gasses external to the encapsulant into the cavity through the pressure inlet port of the shaped cap wafer.

16. The method of claim 15 further comprising:

performing said forming the encapsulated region using a film-assisted molding technique to form the package inlet port.

17. A tire pressure monitoring system comprising:

a wheel module, configured to be mounted in a vehicle tire, comprising a process controller configured to process signals from one or more sensors, a pressure sensor die, coupled to the process controller, and comprising a pressure deformable diaphragm disposed at a region of a first major surface of the pressure sensor die, a shaped cap wafer adhesively coupled to the first major surface of the pressure sensor die, wherein a cavity is formed between a portion of the shaped cap wafer and a portion of the first major surface of the pressure sensor die, the portion of the first major surface of the pressure sensor die comprises the region where the pressure deformable diaphragm is disposed, and the shaped cap wafer includes a pressure inlet port configured to admit gasses external to the cavity into the cavity, and a package substrate, wherein the pressure sensor die is adhesively coupled to the package substrate at a second major surface of the pressure sensor die that opposes the first major surface of the pressure sensor die, and an encapsulant over and around the package substrate, over and around the pressure sensor die, and around the shaped cap wafer, and a radio-frequency (RF) transmitter, coupled to the process controller, configured to transmit sensor information provided by the process controller.

18. The tire pressure monitoring system of claim 17 wherein the shaped cap wafer comprises a silicon wafer shaped to form the cavity.

* * * * *